(12) United States Patent
Baker

(10) Patent No.: US 7,761,773 B2
(45) Date of Patent: Jul. 20, 2010

(54) SEMICONDUCTOR DEVICE INCLUDING A UNIQUE IDENTIFIER AND ERROR CORRECTION CODE

(75) Inventor: David Cureton Baker, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 545 days.

(21) Appl. No.: 11/171,917

(22) Filed: Jun. 30, 2005

(65) Prior Publication Data
US 2007/0002658 A1 Jan. 4, 2007

(51) Int. Cl.
*G11C 29/00* (2006.01)
(52) U.S. Cl. ................... 714/766; 714/758
(58) Field of Classification Search ........ 714/710, 714/763, 758, 766
See application file for complete search history.

(56) References Cited

U.S. PATENT DOCUMENTS

| | | | | |
|---|---|---|---|---|
| 4,926,281 A | * | 5/1990 | Murphy | 361/55 |
| 5,212,693 A | * | 5/1993 | Chao et al. | 714/5 |
| 5,745,673 A | * | 4/1998 | Di Zenzo et al. | 714/7 |
| 5,895,962 A | * | 4/1999 | Zheng et al. | 257/529 |
| 5,910,921 A | | 6/1999 | Beffa et al. | |
| 6,067,507 A | * | 5/2000 | Beffa | 702/118 |
| 6,190,972 B1 | * | 2/2001 | Zheng et al. | 438/275 |
| 6,208,947 B1 | * | 3/2001 | Beffa | 702/118 |
| 6,211,575 B1 | | 4/2001 | Hansford | |
| 6,304,499 B1 | * | 10/2001 | Pochmuller | 365/200 |
| 6,462,998 B1 | * | 10/2002 | Proebsting | 365/205 |
| 6,466,482 B2 | | 10/2002 | Shukuri et al. | |
| 6,628,549 B2 | | 9/2003 | Shukuri et al. | |
| 6,687,170 B2 | * | 2/2004 | Zimmerman et al. | 365/200 |
| 6,697,992 B2 | * | 2/2004 | Ito et al. | 714/763 |
| 6,728,156 B2 | | 4/2004 | Kilmer et al. | |
| 6,769,081 B1 | * | 7/2004 | Parulkar | 714/733 |
| 6,801,471 B2 | * | 10/2004 | Viehmann et al. | 365/230.06 |
| 6,985,390 B2 | * | 1/2006 | Beer | 365/200 |
| 7,069,482 B1 | * | 6/2006 | Callahan | 714/710 |
| 7,162,533 B2 | * | 1/2007 | Klemets | 709/231 |
| 7,162,668 B2 | * | 1/2007 | Roohparvar | 714/710 |
| 7,237,154 B1 | * | 6/2007 | Zorian | 714/711 |
| 2001/0011353 A1 | * | 8/2001 | Little et al. | 713/200 |
| 2002/0000837 A1 | * | 1/2002 | Keeth et al. | 327/51 |
| 2002/0019956 A1 | * | 2/2002 | Carter et al. | 714/4 |
| 2002/0157011 A1 | | 10/2002 | Thomas III | |
| 2003/0103764 A1 | | 6/2003 | Ueda et al. | |
| 2004/0053429 A1 | * | 3/2004 | Muranaka | 438/17 |
| 2004/0129952 A1 | | 7/2004 | Griesmer et al. | |
| 2005/0281076 A1 | * | 12/2005 | Poechmueller | 365/154 |
| 2006/0013395 A1 | * | 1/2006 | Brundage et al. | 380/255 |
| 2007/0267651 A9 | * | 11/2007 | Kobayashi et al. | 257/100 |

OTHER PUBLICATIONS

Sigmatel D-Major MP3 Hard Disk Drive Application Brief, www.sigmatel.com, (2 pgs).

* cited by examiner

*Primary Examiner*—M. Mujtaba K Chaudry
(74) *Attorney, Agent, or Firm*—Toler Law Group

(57) ABSTRACT

A semiconductor device includes a plurality of laser fuses and each laser fuse represents a bit of data. A first set of the plurality of laser fuses represents a unique identifier that corresponds to the semiconductor device. Also, a second set of the plurality of laser fuses represents error correction coding data that corresponds to the unique identifier. The unique identifier can be a digital rights management identification. Also, the error correction coding data is configured for use by a Reed-Solomon error correcting method to correct the unique identifier. Alternatively, the error correction coding data is configured for use by a cyclic redundancy check method.

54 Claims, 4 Drawing Sheets

SEMICONDUCTOR DEVICE INCLUDING A UNIQUE IDENTIFIER AND ERROR CORRECTION CODE

FIELD OF THE DISCLOSURE

The present disclosure relates generally to semiconductor devices having laser fuses.

BACKGROUND

Certain semiconductor devices include one or more laser fuses. The laser fuses can be used to control the functionality of portions of the semiconductor device or the functionality of components coupled to the semiconductor device. For example, certain portable devices can include a semiconductor device having a bank of laser fuses. Typically, prior to programming the laser fuses, the laser fuses are intact and the entire semiconductor device is functional. However, when the laser fuses are programmed, i.e., opened with a laser, one or more portions of the semiconductor device can be disabled.

Further, a laser fuse can be used to set a unique identifier for the semiconductor device. When the laser fuse is intact, it can indicate a logic "0". On the other hand, when the laser fuse is opened, it can indicate a logic "1". Thus, by using a laser to selectively open a portion of a group of laser fuses, a unique identifier comprising a binary string can be programmed.

In certain cases, during manufacture of a semiconductor device, or during post-manufacturing processing of the semiconductors device, one or more laser fuses within the semiconductor device may be partially ablated. Thus, a laser fuse that should indicate a logic "1" because it should have been fully ablated, may incorrectly indicate a logic "0" due to the partial ablation. Thus, when a unique identifier for a semiconductor device is determined and programmed using the laser fuses it may include one or more errors.

Accordingly, there is a need for an improved semiconductor device having laser fuses that are programmed.

DETAILED DESCRIPTION OF THE DRAWING(S)

Figure 1:
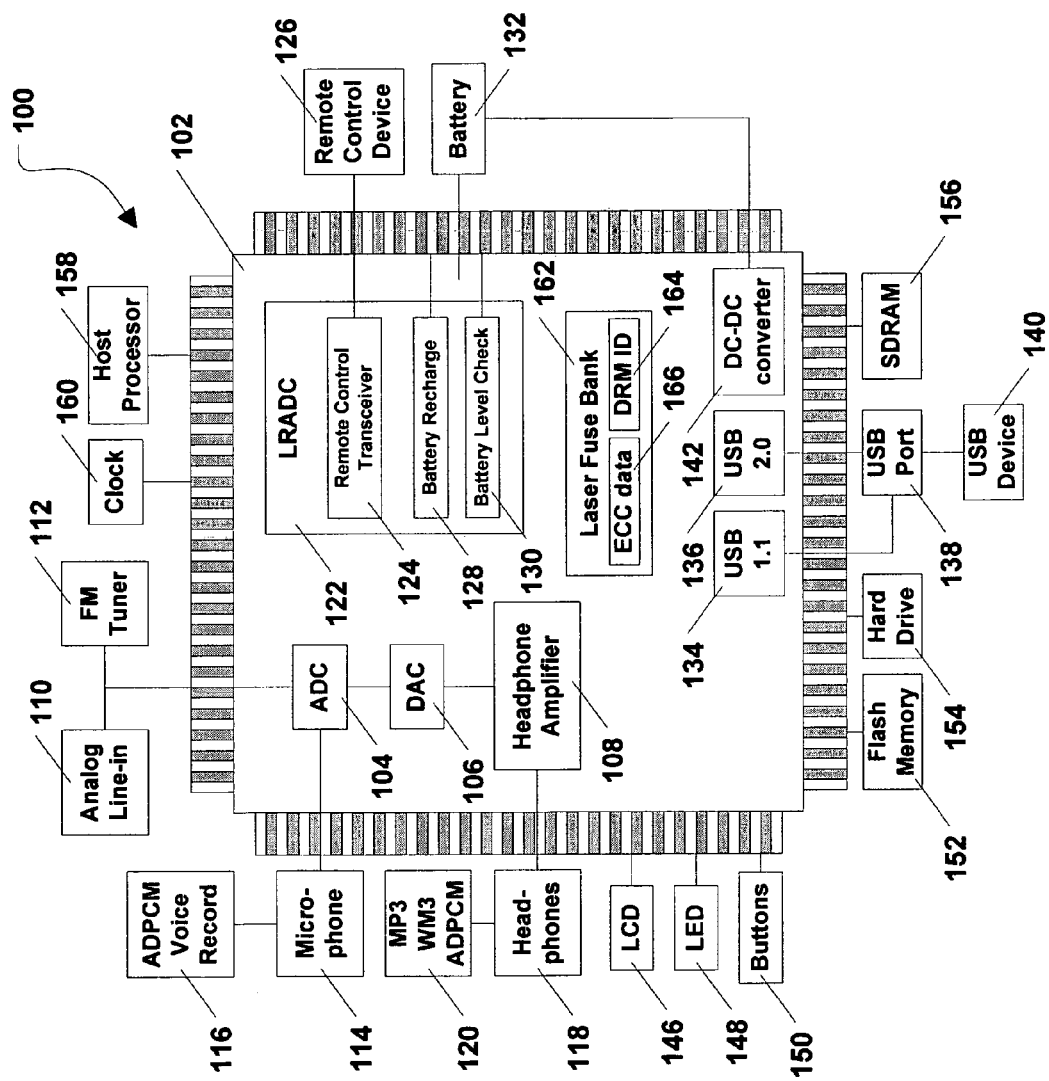
FIG. 1 is a block diagram of an audio system.

A semiconductor device includes a plurality of laser fuses and each laser fuse represents a bit of data. A first set of the plurality of laser fuses represents a unique identifier that corresponds to the semiconductor device. Also, a second set of the plurality of laser fuses represents error correction coding data that corresponds to the unique identifier. In a particular embodiment, the plurality of laser fuses includes no more than 512 laser fuses. Further, in another particular embodiment, the plurality of laser fuses includes no more than 384 laser fuses. Additionally, the first set of laser fuses comprises up to 64 laser fuses that represent the unique identifier, and the second set of laser fuses comprises up to 64 laser fuses that represent the error correction coding data.

In a particular embodiment, the unique identifier is a digital rights management identification. In another particular embodiment, the error correction coding data is configured for use by a Reed-Solomon error correcting method to correct the unique identifier. In still another particular embodiment, the error correction coding data is configured for use by a cyclic redundancy check method.

In a particular embodiment, the semiconductor device also includes an analog-to-digital converter that is coupled to an analog source and a digital-to-analog converter that is coupled to the analog-to-digital converter. Further, the semiconductor device includes a universal serial bus driver that is coupled to a universal serial bus port. Additionally, the semiconductor device can include an amplifier that is coupled to the digital-to-analog converter. Also, the semiconductor device can include a direct current-to-direct current converter that is coupled to a secondary battery. Particularly, the secondary battery provides power to the analog-to-digital converter, the digital-to-analog converter, the amplifier, the universal serial bus driver, and the universal serial bus port.

In another embodiment, a method of evaluating a unique identifier from a semiconductor device includes reading the unique identifier from the semiconductor device. The unique identifier is represented by a first plurality of laser fuses within the semiconductor device. Error correction coding data is also read from the semiconductor device. The error correction coding data corresponds to the unique identifier and the error correction coding data is represented by a second plurality of laser fuses within the semiconductor device.

In still another embodiment, an audio system is provided and includes a semiconductor device that includes an analog-to-digital converter, a digital-to-analog converter coupled to the analog-to-digital converter, an amplifier coupled to the digital-to-analog converter, and a laser fuse bank within the semiconductor device. In a particular embodiment, the laser fuse bank includes a plurality of laser fuses. Each laser fuse represents a bit of data. A first set of the plurality of laser fuses represents a unique identifier that corresponds to the semiconductor device. Also, a second set of the plurality of laser fuses represents error correction coding data that corresponds to the unique identifier.

In yet another embodiment, a method of using a semiconductor device includes retrieving a plurality of laser fuse settings at a processor coupled to a laser. The laser is selectively energized in order to ablate a first group of a plurality of laser fuses on the semiconductor device in order to program a unique identifier. The first group of the plurality of laser fuses is determined based on the plurality of laser fuse settings. The method further includes computing error correction coding data that corresponds to the unique identifier for the semiconductor device.

FIG. 1 shows an exemplary, non-limiting embodiment of an audio system, designated 100. In a particular embodiment, the audio system 100 provides an audio decoder system that can be incorporated in an MP3 flash player or an MP3 hard disk drive. In an illustrative embodiment, shown in FIG. 1, the system 100 includes a semiconductor device 102, i.e., an integrated circuit. As shown, an analog-to-digital converter (ADC) 104 is disposed within the semiconductor device 102. A digital-to-analog converter (DAC) 106 is also disposed within the semiconductor device 102 and is coupled to the ADC 104. Additionally, a headphone amplifier 108 is disposed within the semiconductor device 102. The headphone amplifier 108 is also coupled to the DAC 106.

FIG. 1 further shows an analog line-in 110, a frequency modulation (FM) tuner 112, and a microphone 114 that are coupled to the ADC 104. Further an adaptive differential pulse-code modulation (ADPCM) voice recording module 116 is connected to the microphone. As shown in FIG. 1, a set of headphones 118 can be coupled to the headphone amplifier 108. FIG. 1 also shows an audio file 120 that can be listened to via the headphones 118. In a particular embodiment, the audio file 120 can be an MPEG-1/2 Audio Layer 3 (MP3) file, a Windows media audio (WMA) file, or an ADPCM file.

As shown in FIG. 1, a low resolution analog-to-digital converter (LRADC) system 122 can be disposed within the semiconductor device 102. In an illustrative embodiment, the LRADC system 122 includes a remote control transceiver 124 that is coupled to a remote control device 126. Particularly, the remote control transceiver 124 can be coupled to a remote control device 126 via an infrared (IR) connection or a radio frequency (RF) connection. FIG. 1 also shows that the LRADC system 122 can include a battery recharge module 128 and a battery level check module 130 that is coupled to a battery 132, e.g., a rechargeable secondary battery.

FIG. 1 indicates that the semiconductor device 102 can also include a first universal serial bus (USB) driver 134 and a second USB driver 136. In an illustrative embodiment, the first USB driver 134 is a USB 1.1 driver and the second USB driver 136 is a USB 2.0 driver. Further, each USB driver 134, 136 is connected to a USB port 138. A USB device 140 can be coupled to the semiconductor device 102 via the USB port 140. In a particular embodiment, the USB device 140 can be a computer, or any other device with a USB connection.

Still referring to FIG. 1, the semiconductor device 102 can include a DC-to-DC converter 142 that can be connected to the battery 132. FIG. 1 also shows that a liquid crystal display (LCD) 146 and a light emitting diode (LED) 148 can be coupled to the semiconductor device 102. In a particular embodiment, the LCD 146 can be used to display information relevant to an audio file 120 that is listened to via the headphones 118. Moreover, the LED 148 can indicate that power to the system 100 is on or that the battery 132 for the system 100 is being charged. FIG. 1 also shows that a plurality of buttons 150 can be coupled to the semiconductor device 102. The buttons 150 can be used to control the operation of the system 100.

As shown in FIG. 1, a flash memory device 152 and a hard drive device 154 are coupled to the semiconductor device 102. In a particular embodiment, a plurality of audio files can be stored on the flash memory device 152. Further, a synchronous dynamic random access memory (SDRAM) device 156 can be coupled to the semiconductor device 102. FIG. 1 also shows that a host processor 158 and a clock 160 can be coupled to the semiconductor device 102. In a particular embodiment, the host processor 158 is a microprocessor such as an ARM core. Moreover, the clock 160 is a 24.0 MHz crystal clock in a particular embodiment.

FIG. 1 further shows that the system 100 can include a laser fuse bank 162 that is incorporated into, or otherwise disposed within, the semiconductor device 102. In a particular embodiment, the laser fuse bank 162 includes 384 laser fuses that represent 384 bits of information. The laser fuse bank 162 can include up to 512 laser fuses that represent 512 bits of information. In either case, 128 bits are dedicated to a unique identifier, e.g., a digital rights management identification (DRM ID), and the remaining bits are dedicated to other information related to the semiconductor device. In a particular embodiment, the unique identifier can also include manufacturing information, e.g., a lot code, a wafer number, and a die position. The die position can include an X, Y coordinate. In a particular embodiment, the manufacturing information can be used during failure analysis. A portion of the laser fuses can be included in the circuitry that controls the various subcomponents within the system 100. By selectively breaking the laser fuses, different functions of the system 100 can be disabled.

In a particular embodiment, 64 bits are dedicated to the actual DRM ID 164 and 64 bits are dedicated to error correction coding (ECC) data 166 that can be used to correct errors with the DRM ID 164 that can occur when the DRM ID 164 is programmed during manufacture or during a post-manufacture process. However, depending on the error correction method, the number of bits that represent the ECC data 166 may be greater than the number of bits that represent the DRM ID 164. During operation, when a DRM ID 164 is required to verify that the semiconductor device 102 is authorized to receive, decode, and broadcast digital audio files, the ECC data 166 can be used to ensure that the DRM ID 164 is correct.

In a particular embodiment, the system 100 shown in FIG. 1 can be used in an audio file player, e.g., an MP3 player. Additionally, the system 100 can be used in communication devices, e.g., mobile telephones, pagers, etc. Further, the system 100 can be used in medical devices, e.g., glucose meters, portable heart monitors, etc.

Figure 2:
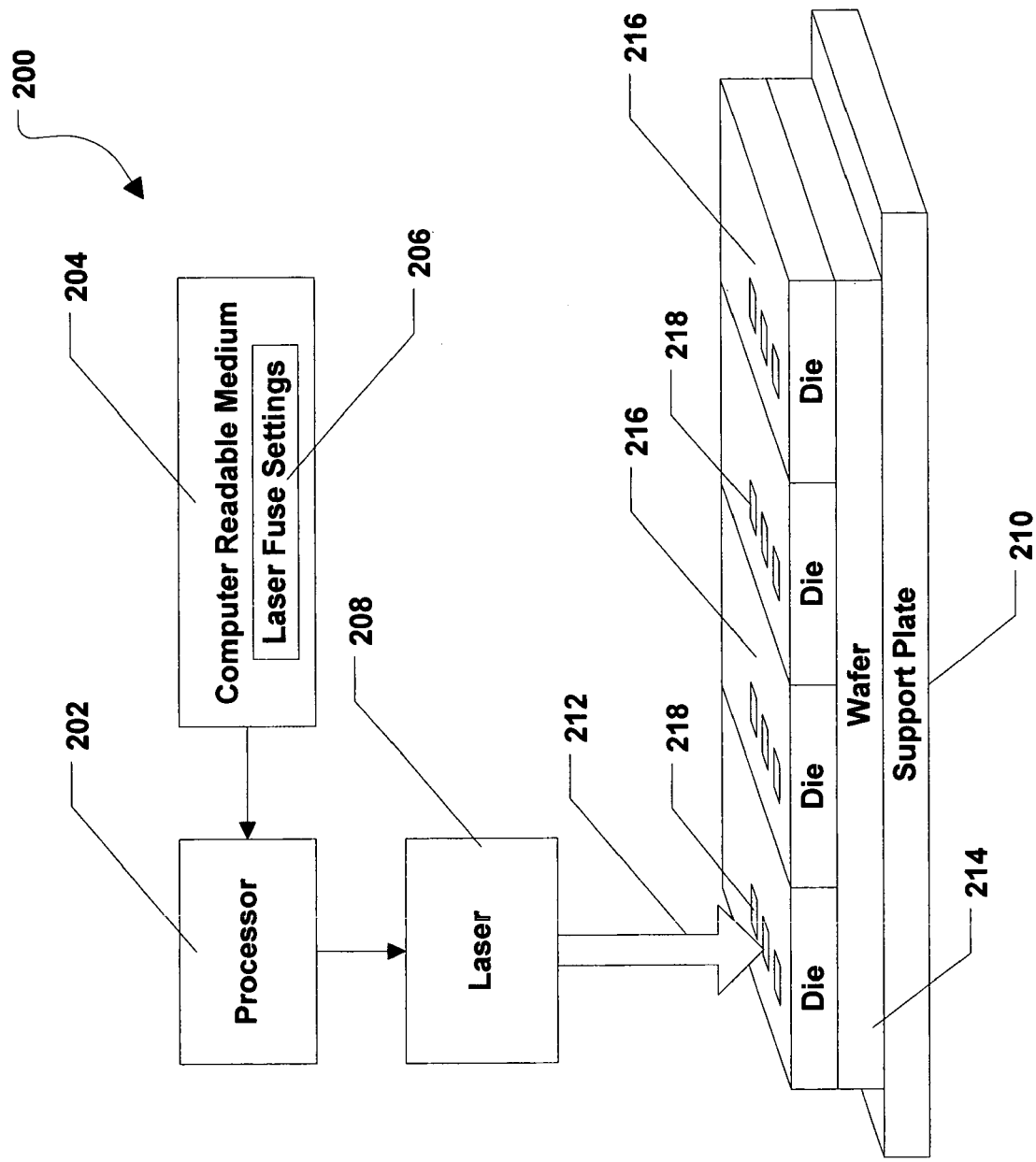
FIG. 2 is a block diagram of a semiconductor device manufacturing system.

Referring to FIG. 2, an exemplary, non-limiting embodiment of a semiconductor manufacturing system is shown and is generally designated 200. As shown, the manufacturing system 200 includes a processor 202. A computer readable medium 204 can be removably coupled to the processor 202. In a particular embodiment, the computer readable medium 204 includes laser fuse setting data 206 that can be read from the computer readable medium 204 by the processor 202.

FIG. 2 further shows a laser 208 that is coupled to the processor 202. A support plate 210 is disposed beneath the laser 208 such that a laser beam 212 can be directed from the laser 208 toward the support plate 210. Additionally, a wafer 214 having a plurality of semiconductor dies 216 can be placed on the support plate 210. Each die 216 can include a bank of laser fuses 218 and during a manufacturing process, the laser 208 can be used to open one or more of the laser fuses 218 in order to prevent current from passing through the laser fuse 218.

Figure 3:
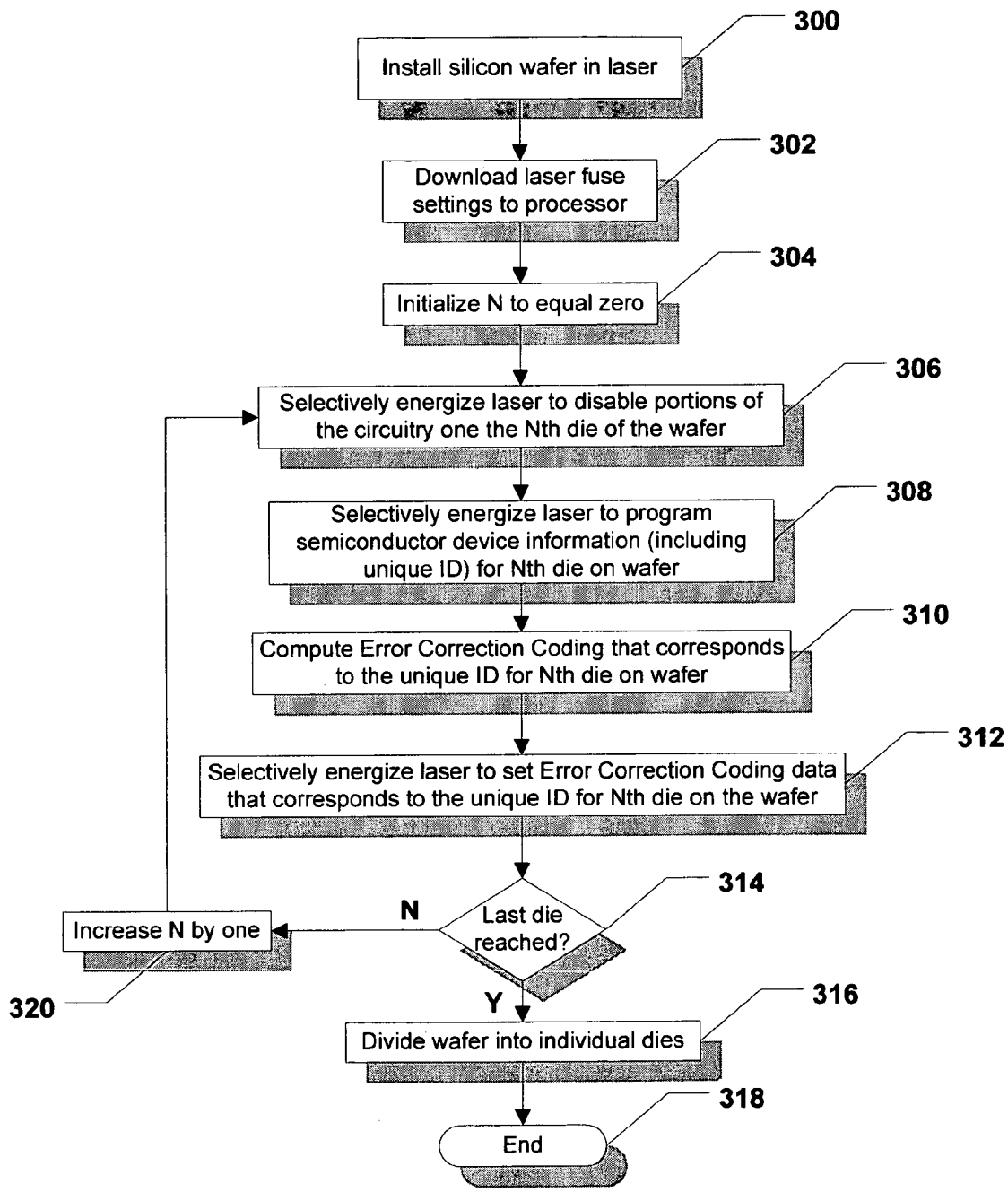
FIG. 3 is a flow chart illustrating a method for manufacturing a semiconductor device.

Referring now to FIG. 3, a method for manufacturing a semiconductor device is shown. Beginning at block 300, a silicon wafer is inserted into a semiconductor manufacturing system, e.g., the system 200 (FIG. 2) shown in FIG. 3. In an illustrative embodiment, a silicon wafer is placed on a support plate 210 (FIG. 2) within the system 200 (FIG. 2). At block 302, laser fuse settings 206 (FIG. 2) are downloaded to the processor 202 (FIG. 2), e.g., from the computer readable medium 204 (FIG. 2). Thereafter, a variable, N, is initialized to equal one at block 304. Moving to block 306, the laser 208 (FIG. 2) is selectively energized in order to enable or disable portions of the circuitry on the Nth die 216 (FIG. 2) on the wafer 214 (FIG. 2). In a particular embodiment, portions of the circuitry on the Nth die can be enabled or disabled by opening one or more of the laser fuses 218 (FIG. 2) on the die 216 (FIG. 2).

Proceeding to block 308, the laser 208 (FIG. 2) is selectively energized to program semiconductor device information for the Nth die 216 (FIG. 2) on the wafer 214 (FIG. 2). The information can include a unique identification (ID) number, e.g., a DRAM ID number. Further, the unique ID can be programmed by opening a predetermined sequence of laser fuses 218 (FIG. 2) on the die 216 (FIG. 2). Thereafter, at block 310, error correction coding (ECC) corresponding to the unique ID for the Nth die 216 (FIG. 2) on the wafer 214 (FIG. 2) is computed. Moving to block 312, the laser 208

(FIG. 2) is selectively energized in order to program the ECC data corresponding to the unique ID for the Nth die 216 (FIG. 2) on the wafer 214 (FIG. 2).

At decision step 314, a determination is made to determine whether the last die 216 (FIG. 2) on the wafer 214 (FIG. 2) has been reached. If so, the wafer 214 (FIG. 2) is divided into individual dies 216 (FIG. 2) at block 316. The logic then ends at state 318. At decision step 316, if the last die has not been reached, the logic moves to block 320 and N is increased by one. The logic then returns to block 208 and continues as described above. Accordingly, a unique ID and corresponding ECC data can be programmed on each individual die 216 (FIG. 2) on the wafer 214 (FIG. 2). In a particular embodiment, after each die is successfully processed as described herein, each die can be installed in a portable device such as an MP3 player.

Figure 4:
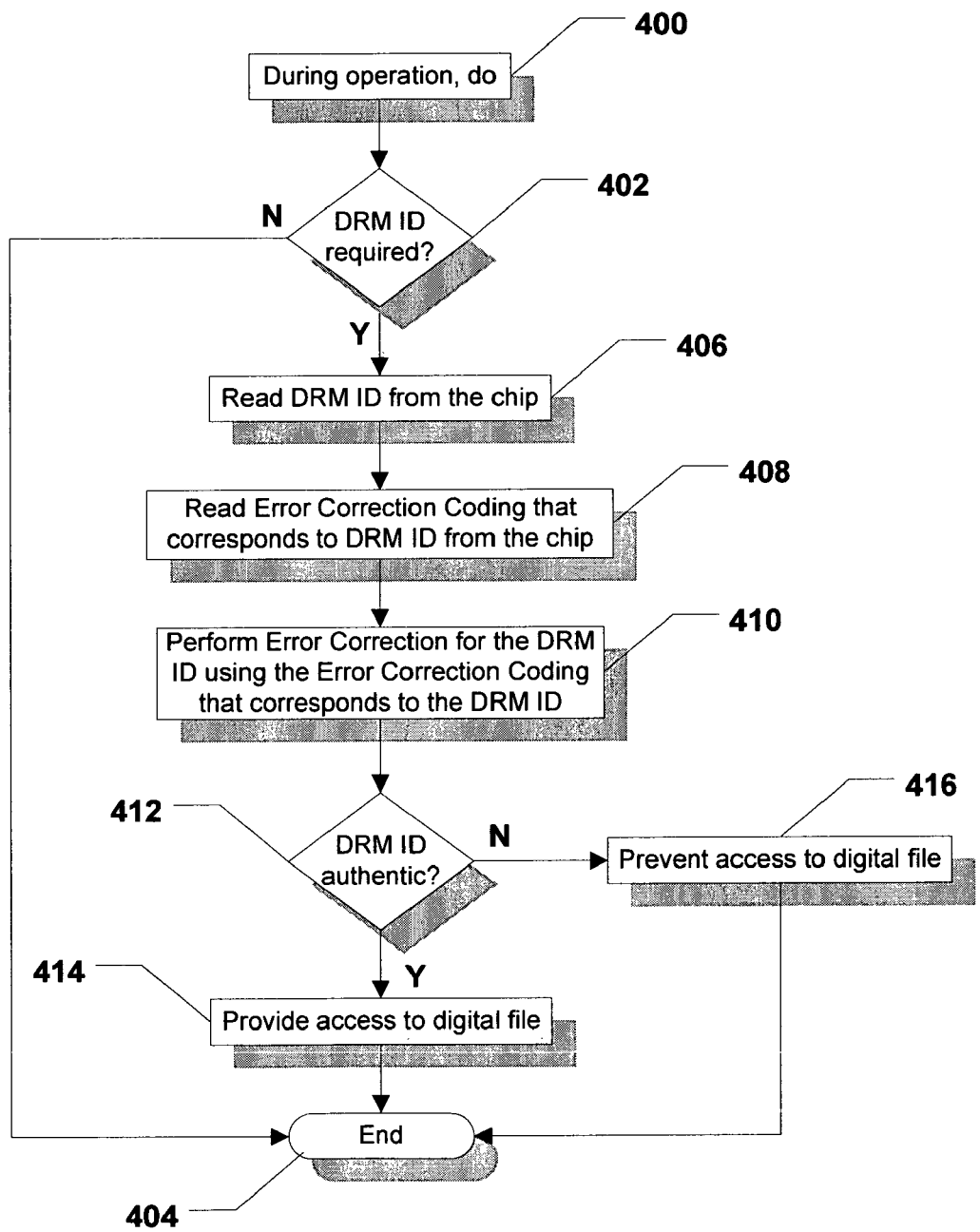
FIG. 4 is a flow chart illustrating a method for operating a semiconductor device.

Referring now to FIG. 4, an exemplary, non-limiting method of operation of an audio decoder is shown and commences at block 400 with a loop, wherein the succeeding steps are performed. At decision step 402, a decision is undertaken in order to ascertain whether a DRM ID required to access a digital file. If a DRM ID is not required, the logic ends at state 404. On the other hand, if a DRM ID is required to access a digital file, the logic proceeds to block 406. At block 406, a DRM ID is read from the semiconductor device, e.g., by reading the binary values programmed into the bank of laser fuses during manufacturing of the semiconductor device. Moving to block 408, ECC data that corresponds to the DRM ID on the chip is read from the chip, e.g., by reading the binary values previously programmed during the manufacturing process.

At block 410, error correction is performed for the DRM ID using the ECC data that corresponds to the DRM ID. Error correction can detect and correct errors with the DRM ID using the ECC data. Particularly, the ECC data is a representation of the DRM ID, not simply a copy of the DRM ID. The ECC data may include redundant data. Further, the ECC is a code in which the ECC data, e.g., the representation of the DRM ID, conforms to specific rules of construction. Departures in the ECC data from the rules of construction can be automatically detected and corrected. In a particular embodiment, Reed-Solomon error correction is used to detect and correct errors in the DRM ID. Further, cyclic redundancy check (CRC) data can be used to detect an error in the DRM ID. Moving to decision step 412, a decision is made in order to determine whether the DRM ID is authenticated. If so, the logic moves to block 414 and access is provided to a digital file. The logic then ends at state 404. If the DRM ID is not authentic, the logic moves to block 416 and access to the digital file is prevented. The logic then ends at state 404. Accordingly, in a device such as an MP3 player, the DRM ID can be used to determine if the device is licensed to receive and access MP3 files from a content provider, e.g., an online source. Particularly, the device can also decode the MP3 files when it is licensed by a content provider.

With the configuration of structure described above, the semiconductor device includes a unique identifier stored in a bank of laser fuses that can be used to prevent unauthorized access to digital files, e.g., digital audio files. Moreover, the semiconductor device includes error correction code information that can be used to ensure that the unique identifier for the semiconductor device is correct. As such, if any of the laser fuses representing the unique identifier have been incompletely ablated and are registering an incorrect logic value, the error correction code information can correct the unique identifier.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
   plurality of laser fuses, each laser fuse representing a bit of data;
   wherein a first set of the plurality of laser fuses represents a unique identifier corresponding to the semiconductor device;
   wherein a second set of the plurality of laser fuses represents error correction coding data comprising a representation of the unique identifier corresponding to the semiconductor device, the error correction coding data being sufficient to correct multiple errors in the unique identifier corresponding to the semiconductor device;
   wherein a corrected digital rights management (DRM) identification for accessing a digital file that requires DRM identification is determined based on the unique identifier and the error correction coding data; and
   wherein the corrected DRM identification includes information to verify that the semiconductor device is authorized to access the digital file that requires DRM identification.

2. The semiconductor device of claim 1, wherein the plurality of laser fuses includes no more than 512 laser fuses.

3. The semiconductor device of claim 2, wherein the plurality of laser fuses includes no more than 384 laser fuses.

4. The semiconductor device of claim 3, wherein the first set of laser fuses comprises up to 64 laser fuses that represent the unique identifier corresponding to the semiconductor device.

5. The semiconductor device of claim 4, wherein the second set of laser fuses comprises up to 64 laser fuses that represent the error correction coding data.

6. The semiconductor device of claim 1, wherein the access to the digital file includes at least one of receiving, decoding, and broadcasting the digital file.

7. The semiconductor device of claim 6, wherein the unique identifier corresponding to the semiconductor device further includes manufacturing information.

8. The semiconductor device of claim 7, wherein the manufacturing information includes at least one of the following: a lot code, a wafer number, and a die position.

9. The semiconductor device of claim 1, wherein the error correction coding data is configured for use by a Reed-Solomon error correcting method to correct the unique identifier corresponding to the semiconductor device.

10. The semiconductor device of claim 1, wherein the error correction coding data is configured for use by a cyclic redundancy check method.

11. The semiconductor device of claim 1, further comprising an analog-to-digital converter coupled to an analog source.

12. The semiconductor device of claim 11, further comprising a digital-to-analog converter coupled to the analog-to-digital converter.

13. The semiconductor device of claim 12, further comprising a universal serial bus driver coupled to a universal serial bus port.

14. The semiconductor device of claim 13, further comprising an amplifier coupled to the digital-to-analog converter.

15. The semiconductor device of claim 14, further comprising a direct current-to-direct current converter coupled to a secondary battery, the secondary battery providing power to the analog-to-digital converter, the digital-to-analog converter, the amplifier, the universal serial bus driver, and the universal serial bus port.

16. The semiconductor device of claim 1, wherein the second set of laser fuses includes more laser fuses than the first set of laser fuses.

17. The semiconductor device of claim 1, wherein the unique identifier corresponding to the semiconductor device includes a digital rights management identifier.

18. The semiconductor device of claim 1, further comprising:
a processor and a memory, wherein the processor and the memory are used to determine the DRM identification.

19. A method of evaluating a unique identifier corresponding to a semiconductor device from the semiconductor device, the method comprising:
reading the unique identifier corresponding to the semiconductor device from the semiconductor device, wherein the unique identifier corresponding to the semiconductor device is represented by a first plurality of laser fuses within the semiconductor device, the unique identifier corresponding to the semiconductor device including information to verify that the semiconductor device is authorized to access a digital file;
reading error correction coding data from the semiconductor device, wherein the error correction coding data comprises a representation of the unique identifier corresponding to the semiconductor device, the error correction coding data is sufficient to correct multiple errors in the unique identifier corresponding to the semiconductor device, and the error correction coding data is represented by a second plurality of laser fuses within the semiconductor device;
determining a corrected digital rights management (DRM) identification based on the unique identifier and the error correction coding data;
determining an authenticity of the corrected DRM identification; and
accessing the digital file when the corrected DRM identification is authentic.

20. The method of claim 19, further comprising:
performing an error correction method for the unique identifier corresponding to the semiconductor device using the error correction data.

21. The method of claim 20, wherein the error correction method is the Reed-Solomon error correction method.

22. The method of claim 19, further comprising:
prohibiting access to the digital file when the DRM identification is not authentic.

23. The method of claim 19, further comprising:
allowing access to a second digital file that does not require DRM identification.

24. The method of claim 19, wherein accessing the digital file comprises receiving the digital file.

25. The method of claim 19, wherein accessing the digital file comprises decoding the digital file.

26. The method of claim 19, wherein accessing the digital file comprises broadcasting the digital file.

27. An audio system, comprising:
a semiconductor device including an analog-to-digital converter, a digital-to-analog converter coupled to the analog-to-digital converter, an amplifier coupled to the digital-to-analog converter, and a laser fuse bank within the semiconductor device, the laser fuse bank comprising:
a plurality of laser fuses, each laser fuse representing a bit of data;
wherein a first set of the plurality of laser fuses represents a unique identifier corresponding to the semiconductor device, the unique identifier corresponding to the semiconductor device including information to verify that the audio system is authorized to access a digital file; and
wherein a second set of the plurality of laser fuses represents error correction coding data comprising a representation of the unique identifier corresponding to the semiconductor device, the error correction coding being sufficient to correct multiple errors in the unique identifier corresponding to the semiconductor device; and
wherein a corrected digital rights management (DRM) identification based on the unique identifier and the error correction coding data is determined and used to access the digital file when access to the digital file requires DRM identification.

28. The audio system of claim 27, wherein the plurality of laser fuses includes no more than 512 laser fuses.

29. The audio system of claim 28, wherein the plurality of laser fuses includes no more than 384 laser fuses.

30. The audio system of claim 29, wherein the first set of laser fuses comprises up to 64 laser fuses.

31. The audio system of claim 30, wherein the second set of laser fuses comprises up to 64 laser fuses.

32. The audio system of claim 27, wherein the access to the digital file includes broadcasting the digital file.

33. The audio system of claim 27, wherein the unique identifier corresponding to the semiconductor device includes manufacturing information.

34. The audio system of claim 33, wherein the manufacturing information includes at least one of the following: a lot code, a wafer number, and a die position.

35. The audio system of claim 27, further comprising a secondary battery coupled to the semiconductor device.

36. The audio system of claim 35, further comprising a battery recharge module coupled to the secondary battery.

37. The audio system of claim 36, further comprising a battery level check module coupled to the secondary battery.

38. The audio system of claim 27, wherein the system can receive and decode an audio file when the unique identifier corresponding to the semiconductor device is authenticated.

39. The audio system of claim 27, further comprising a microphone coupled to the analog-to-digital converter.

40. The audio system of claim 27, further comprising a frequency modulation tuner coupled to the analog-to-digital converter.

41. The audio system of claim 27, further comprising a hard drive coupled to the semiconductor device.

42. The audio system of claim 27, further comprising a flash memory coupled to the semiconductor device.

43. The audio system of claim 27, further comprising a random access memory device coupled to the semiconductor device.

44. A method of using a semiconductor device, the method comprising:
retrieving a plurality of laser fuse settings at a processor coupled to a laser;
selectively energizing the laser in order to ablate a first group of a plurality of laser fuses on the semiconductor device in order to program a unique identifier corresponding to the semiconductor device, the first group of the plurality of laser fuses determined based on the plurality of laser fuse settings;

computing error correction coding data comprising a representation of the unique identifier corresponding to the semiconductor device, the error correction coding being sufficient to correct multiple errors in the unique identifier corresponding to the semiconductor device;

selectively energizing the laser in order to ablate a second group of the plurality of laser fuses on the semiconductor device in order to program the error correction coding data; and wherein the unique identifier corresponding to the semiconductor device and the error correction coding data are used to determine a corrected digital rights management identification used to verify that the semiconductor device is authorized to access a digital file when access to the digital file requires digital rights management identification.

45. The method of claim 44, wherein the semiconductor device comprises a wafer having a plurality of semiconductor dies and each semiconductor die includes laser fuses that represent the unique identifier corresponding to the semiconductor device and that represent the error correction coding data corresponding to the unique identifier corresponding to the semiconductor device.

46. The method of claim 45, further comprising:
selectively energizing the laser in order to ablate a third group of the plurality of laser fuses on the semiconductor device.

47. A system, comprising:
a semiconductor device including a laser fuse bank, the laser fuse bank comprising:
a plurality of laser fuses, each laser fuse representing a bit of data;

wherein a first set of the plurality of laser fuses represents a unique identifier corresponding to the semiconductor device, the unique identifier corresponding to the semiconductor device including information to verify that the system is authorized to access a digital file;

wherein a second set of the plurality of laser fuses represents error correction coding data comprising a representation of the unique identifier corresponding to the semiconductor device, the error coding data being sufficient to correct multiple errors in the unique identifier corresponding to the semiconductor device; and wherein a corrected digital rights management (DRM) identification based on the unique identifier and the error correction coding data is determined and used to access the digital file when access to the digital file requires DRM identification.

48. The system of claim 47, wherein the plurality of laser fuses includes no more than 512 laser fuses.

49. The system of claim 48, wherein the plurality of laser fuses includes no more than 384 laser fuses.

50. The system of claim 49, wherein the first set of laser fuses comprises up to 64 laser fuses.

51. The system of claim 50, wherein the second set of laser fuses comprises up to 64 laser fuses.

52. The system of claim 47, wherein the access to the digital file includes at least one of receiving, decoding, and broadcasting the digital file.

53. The system of claim 47, wherein the unique identifier corresponding to the semiconductor device includes manufacturing information.

54. The system of claim 53, wherein the manufacturing information includes at least one of the following: a lot code, a wafer number, and a die position.

* * * * *